(12) United States Patent
Mun et al.

(10) Patent No.: US 11,676,927 B2
(45) Date of Patent: Jun. 13, 2023

(54) SEMICONDUCTOR PACKAGE DEVICE

(71) Applicant: SAMSUNG ELECTRONICS CO., LTD., Suwon-si (KR)

(72) Inventors: Kyung Don Mun, Hwaseong-si (KR); Myungsam Kang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 52 days.

(21) Appl. No.: 17/317,309

(22) Filed: May 11, 2021

(65) Prior Publication Data
US 2022/0115350 A1 Apr. 14, 2022

(30) Foreign Application Priority Data
Oct. 8, 2020 (KR) .................. 10-2020-0130542

(51) Int. Cl.
*H01L 23/00* (2006.01)
*H01L 23/31* (2006.01)
(Continued)

(52) U.S. Cl.
CPC .......... *H01L 24/20* (2013.01); *H01L 21/4853* (2013.01); *H01L 21/4857* (2013.01);
(Continued)

(58) Field of Classification Search
CPC . H01L 24/20; H01L 21/4853; H01L 21/4857; H01L 21/565; H01L 21/568;
(Continued)

(56) References Cited

U.S. PATENT DOCUMENTS 9,508,664 B1 11/2016 Lin et al.
10,163,817 B2 12/2018 Lin et al.
(Continued)

*Primary Examiner* — Kyoung Lee
*Assistant Examiner* — Christina A Sylvia
(74) *Attorney, Agent, or Firm* — Sughrue Mion, PLLC

(57) ABSTRACT

Provided is a semiconductor package device including a lower redistribution substrate including a first redistribution pattern, the first redistribution pattern including a first interconnection portion and a first via portion provided on the first interconnection portion, a semiconductor chip disposed on the lower redistribution substrate, the semiconductor chip including a chip pad facing the lower redistribution substrate, an upper redistribution substrate vertically spaced apart from the lower redistribution substrate, the upper redistribution substrate including a second redistribution pattern, a vertical conductive structure disposed between the lower redistribution substrate and the upper redistribution substrate and disposed at a side of the semiconductor chip, a third redistribution pattern disposed between the lower redistribution substrate and the vertical conductive structure, and an encapsulant disposed on the semiconductor chip, the vertical conductive structure, and the third redistribution pattern, wherein the first via portion is in contact with the third redistribution pattern, and wherein a level of a bottom surface of the vertical conductive structure is higher than a level of a bottom surface of the chip pad.

19 Claims, 17 Drawing Sheets

(51) Int. Cl.
*H01L 23/538* (2006.01)
*H01L 21/683* (2006.01)
*H01L 21/48* (2006.01)
*H01L 21/56* (2006.01)
*H01L 25/00* (2006.01)
*H01L 25/10* (2006.01)

(52) U.S. Cl.
CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 25/105* (2013.01); *H01L 25/50* (2013.01); *H01L 2221/68372* (2013.01); *H01L 2224/214* (2013.01); *H01L 2225/1035* (2013.01); *H01L 2225/1041* (2013.01); *H01L 2225/1058* (2013.01)

(58) Field of Classification Search
CPC ............. H01L 21/6835; H01L 23/3128; H01L 23/5383; H01L 23/5386; H01L 23/5389; H01L 24/19; H01L 25/105; H01L 25/50; H01L 2221/68372; H01L 2224/214; H01L 2225/1035; H01L 2225/1041; H01L 2225/1058; H01L 23/49827; H01L 23/295; H01L 23/49816; H01L 21/561; H01L 2221/68345; H01L 2221/68359; H01L 25/117; H01L 23/31; H01L 23/367; H01L 23/481; H01L 23/485; H01L 23/525; H01L 24/06; H01L 24/09
See application file for complete search history.

(56) References Cited

U.S. PATENT DOCUMENTS

| | | | |
|---|---|---|---|
| 10,269,764 B2 | 4/2019 | Chen et al. | |
| 10,566,261 B2 | 2/2020 | Pei et al. | |
| 10,672,738 B2 | 6/2020 | Yu et al. | |
| 2009/0239336 A1* | 9/2009 | Lee | H01L 21/6835 257/E21.705 |
| 2015/0262950 A1* | 9/2015 | Cate | H01L 24/17 257/737 |
| 2016/0043047 A1* | 2/2016 | Shim | H01L 21/561 438/126 |
| 2017/0084589 A1* | 3/2017 | Kuo | H01L 23/3128 |
| 2019/0198486 A1* | 6/2019 | Kim | H01L 24/96 |
| 2020/0035661 A1 | 1/2020 | Yu et al. | |
| 2020/0043853 A1 | 2/2020 | Kim et al. | |
| 2020/0135694 A1 | 4/2020 | Hung et al. | |

\* cited by examiner

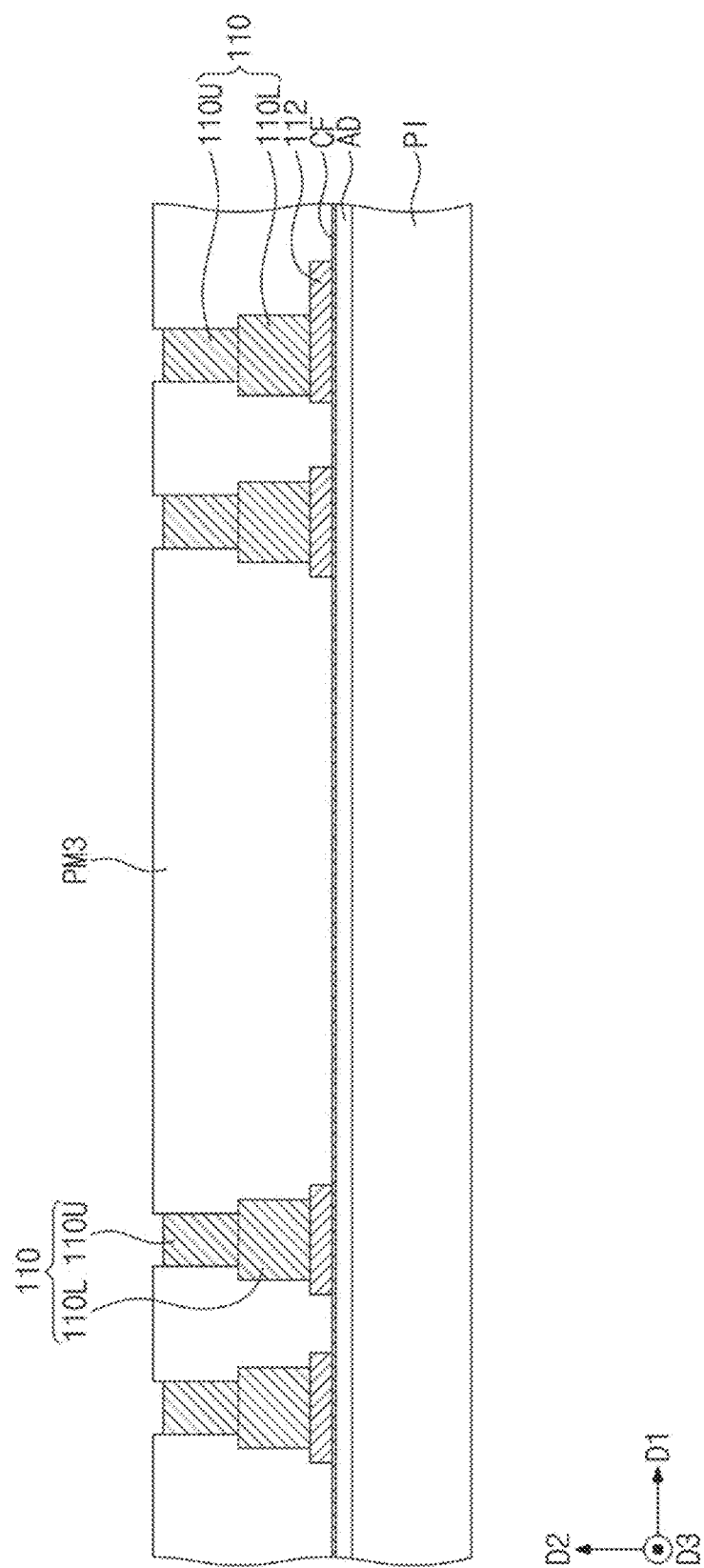

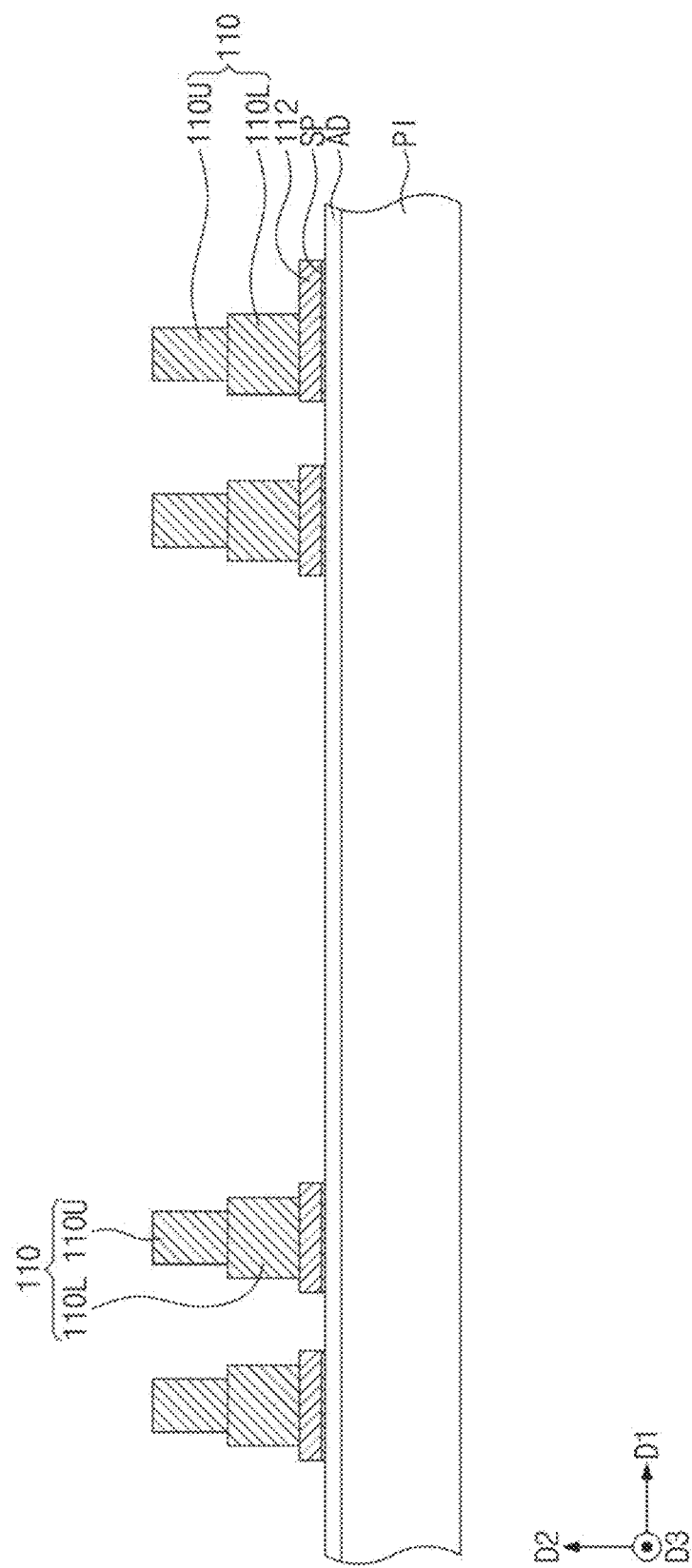

SEMICONDUCTOR PACKAGE DEVICE

CROSS-REFERENCE TO RELATED APPLICATION

This U.S. non-provisional patent application claims priority under 35 U.S.C. § 119 to Korean Patent Application No. 10-2020-0130542, filed on Oct. 8, 2020, in the Korean Intellectual Property Office, the disclosure of which is hereby incorporated by reference in its entirety.

BACKGROUND

Example embodiments of the present disclosure relate to a semiconductor package device.

As semiconductor chips have become smaller in size and higher in performance, a semiconductor package with improved rigidity and heat dissipation characteristics and a package-on-package (POP) structure including a plurality of coupled packages have been studied. There is a need to develop a semiconductor package which has a POP structure and improved rigidity and heat dissipation characteristics by introducing a conductive structure therein.

SUMMARY

One or more example embodiments provide a semiconductor package device with improved reliability.

According to an aspect of an example embodiment, there is provided a semiconductor package device including a lower redistribution substrate including a first redistribution pattern, the first redistribution pattern including a first interconnection portion and a first via portion provided on the first interconnection portion, a semiconductor chip disposed on the lower redistribution substrate, the semiconductor chip including a chip pad facing the lower redistribution substrate, an upper redistribution substrate vertically spaced apart from the lower redistribution substrate, the upper redistribution substrate including a second redistribution pattern, a vertical conductive structure disposed between the lower redistribution substrate and the upper redistribution substrate and disposed at a side of the semiconductor chip, a third redistribution pattern disposed between the lower redistribution substrate and the vertical conductive structure, and an encapsulant disposed on the semiconductor chip, the vertical conductive structure, and the third redistribution pattern, wherein the first via portion is in contact with the third redistribution pattern, and wherein a level of a bottom surface of the vertical conductive structure is higher than a level of a bottom surface of the chip pad.

According to another aspect of an example embodiment, there is provided a semiconductor package device including a lower redistribution substrate including a first insulating layer and a first redistribution pattern, a semiconductor chip disposed on the lower redistribution substrate, an upper redistribution substrate vertically spaced apart from the lower redistribution substrate, the upper redistribution substrate including a second insulating layer and a second redistribution pattern, a vertical conductive structure disposed between the lower redistribution substrate and the upper redistribution substrate and disposed at a side of the semiconductor chip, a third redistribution pattern disposed between the lower redistribution substrate and the vertical conductive structure, and an encapsulant disposed on the semiconductor chip, the vertical conductive structure, and the third redistribution pattern, wherein an insulating material of the first insulating layer is different from an insulating material of the encapsulant, wherein a top surface and a side surface of the third redistribution pattern are in contact with the encapsulant, and wherein a bottom surface of the third redistribution pattern is in contact with the first insulating layer.

According to another aspect of an example embodiment, there is provided a semiconductor package device including a first semiconductor package, a second semiconductor package disposed on the first semiconductor package, and a plurality of first connection terminals disposed between the first semiconductor package and the second semiconductor package, wherein the first semiconductor package includes a lower redistribution substrate, a semiconductor chip being in contact with the lower redistribution substrate, the semiconductor chip including chip pads adjacent to the lower redistribution substrate, a plurality of vertical conductive structures disposed on a first surface of the lower redistribution substrate and spaced apart from a side surface of the semiconductor chip, an upper redistribution substrate vertically spaced apart from the lower redistribution substrate with the semiconductor chip interposed therebetween, second connection terminals disposed under the lower redistribution substrate, and first redistribution patterns disposed between the lower redistribution substrate and the plurality of vertical conductive structures, wherein the lower redistribution substrate includes an insulating layer, and second redistribution patterns which are vertically stacked in the insulating layer, each of the second redistribution patterns including a second interconnection portion and a via portion, wherein at least one of the first redistribution patterns includes a first pad portion, a second pad portion, and a first interconnection portion connecting the first pad portion and the second pad portion, wherein the first pad portion is connected to a vertical conductive structure among the plurality of vertical conductive structures, and the second pad portion is connected to a via portion of a second redistribution pattern among the second redistribution patterns, wherein each of the plurality of vertical conductive structures has a pillar shape, wherein a height of each of the vertical conductive structures ranges from 80 μm to 120 μm, and wherein a diameter of each of the vertical conductive structures ranges from 60 μm to 75 μm.

BRIEF DESCRIPTION OF THE DRAWINGS

The above and/or other aspects of example embodiments will be more clearly understood from the following detailed description, taken in conjunction with the accompanying drawings, in which:

FIGS. 17, 18, 19, and 20 are cross-sectional views illustrating a method of manufacturing the semiconductor package device of FIG. 14.

DETAILED DESCRIPTION OF THE EMBODIMENTS

Hereinafter, example embodiments will be described in detail with reference to the accompanying drawings.

Figure 1:
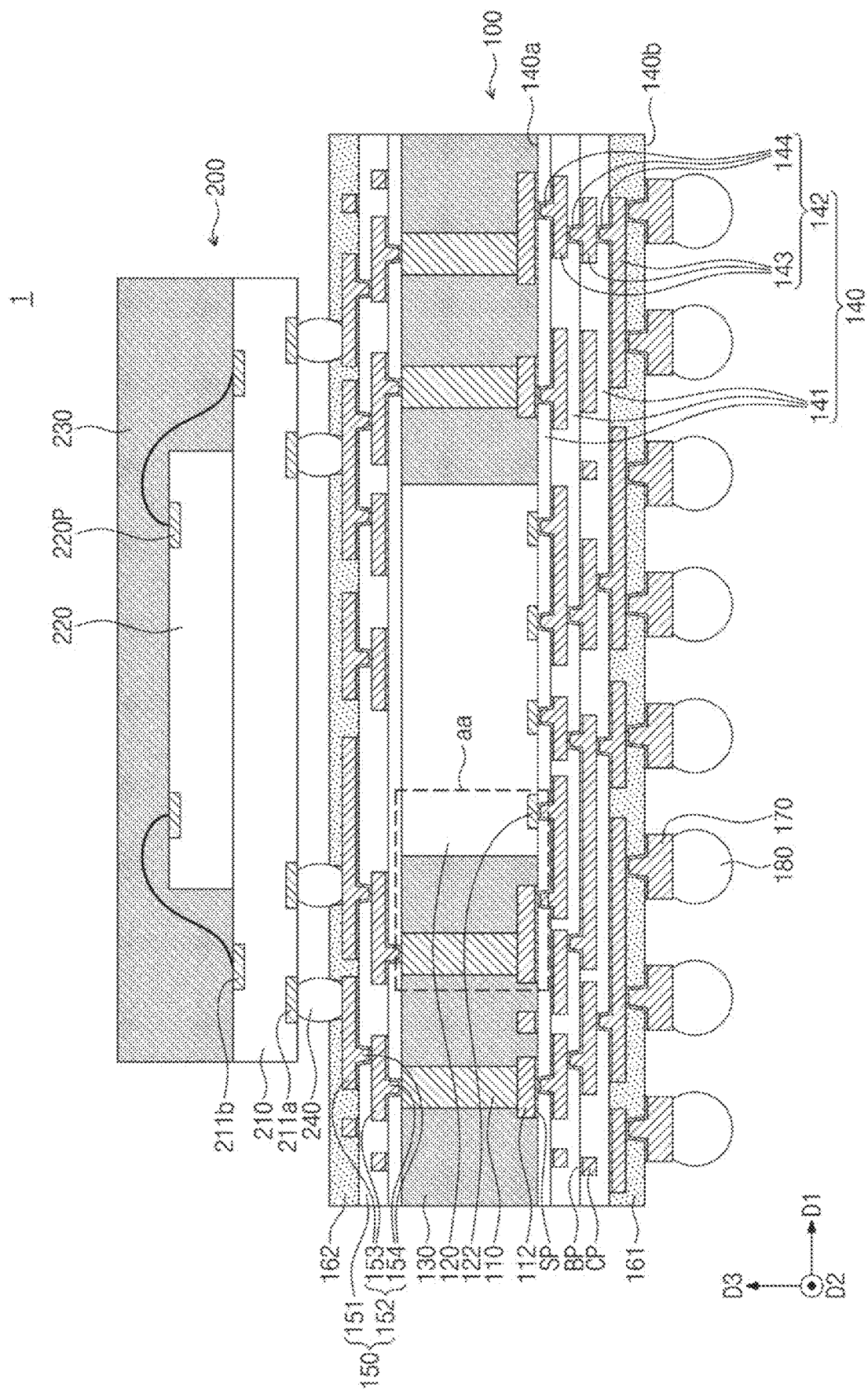
FIG. 1 is a cross-sectional view illustrating a semiconductor package device according to example embodiments.
Figure 2:
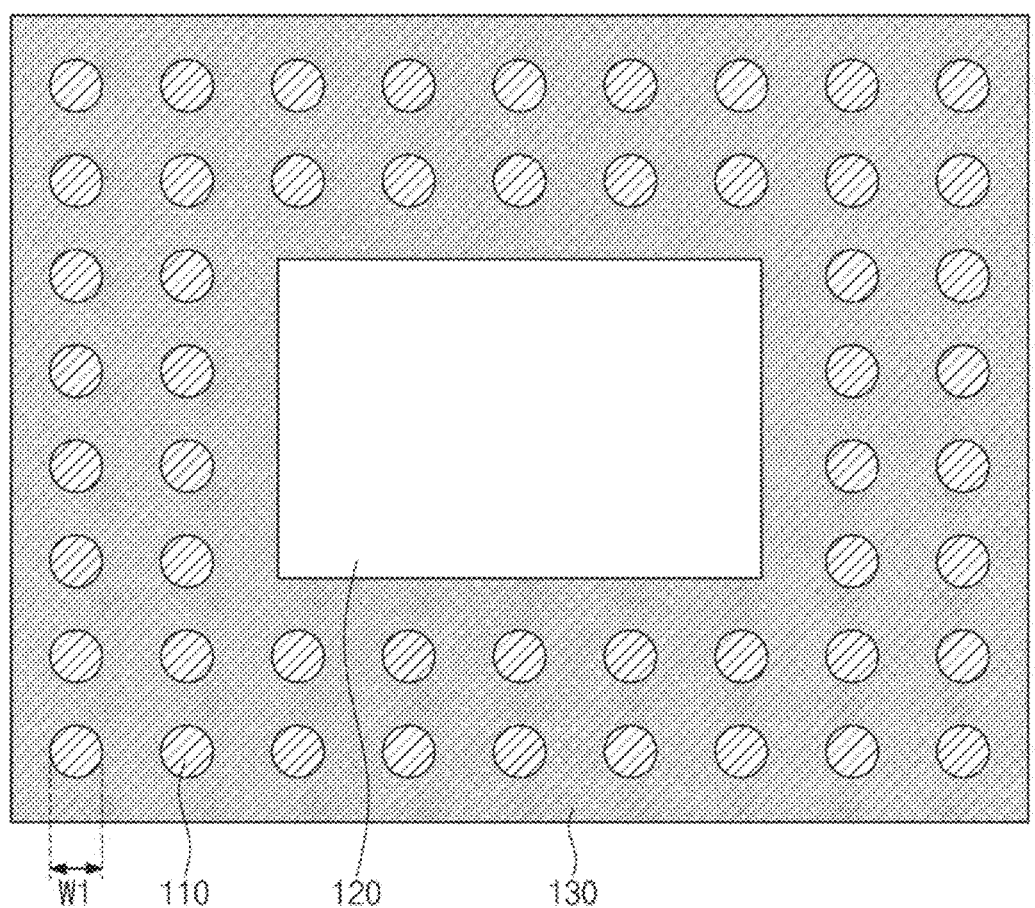
FIG. 2 is a plan view illustrating a first semiconductor package of FIG. 1.
Figure 3:
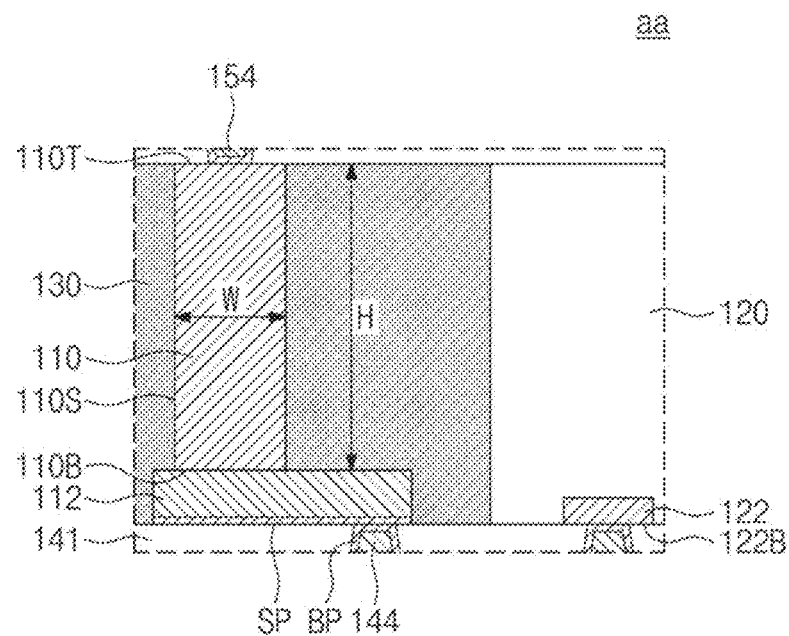
FIG. 3 is an enlarged view of a portion 'aa' of FIG. 1.

FIG. 1 is a cross-sectional view illustrating a semiconductor package device according to example embodiments. FIG. 2 is a plan view illustrating a first semiconductor package of FIG. 1. Some components of FIG. 1 are omitted in FIG. 2 for clarity of other components. FIG. 3 is an enlarged view of a portion 'aa' of FIG. 1.

Referring to FIG. 1, a semiconductor package device 1 according to example embodiments may include a first semiconductor package 100 and a second semiconductor package 200 provided on the first semiconductor package 100. The semiconductor package device 1 may have a package-on-package (POP) structure.

The first semiconductor package 100 may include a lower redistribution substrate 140, a first semiconductor chip 120, a vertical conductive structure 110, an encapsulant 130, an upper redistribution substrate 150, an under bump pattern 170, and an external connection terminal 180.

The lower redistribution substrate 140 may include first insulating layers 141, and first redistribution patterns 142 disposed in the first insulating layers 141. The lower redistribution substrate 140 may further include a first passivation layer 161 disposed under the first insulating layers 141, and the under bump patterns 170 disposed in the first passivation layer 161.

The lower redistribution substrate 140 may have a first surface 140a and a second surface 140b which are opposite to each other. A direction parallel to the first surface 140a of the lower redistribution substrate 140 may be defined as a first direction D1. A direction which is parallel to the first surface 140a of the lower redistribution substrate 140 and perpendicular to the first direction D1 may be defined as a second direction D2. A direction perpendicular to the first surface 140a of the lower redistribution substrate 140 may be defined as a third direction D3.

The first insulating layers 141 may be sequentially stacked in the third direction D3. Three first insulating layers 141 are illustrated in FIG. 1. However, embodiments are not limited thereto. In example embodiments, at least one insulating layer may be added into the first insulating layers 141, or one or more of the first insulating layers 141 may be omitted. Interfaces between the first insulating layers 141 may not be observed. For example, the first insulating layers 141 may be integrally connected as a single insulating layer. The first insulating layers 141 may include a photosensitive insulating material. For example, the photosensitive insulating material may include at least one of photosensitive polyimide, polybenzoxazole, a phenol-based polymer, or a benzocyclobutene-based polymer.

Each of the first redistribution patterns 142 may include a seed/barrier pattern BP and a conductive pattern CP. The seed/barrier pattern BP may include, for example, copper/titanium. The conductive pattern CP may include, for example, copper. Each of the first redistribution patterns 142 may include a first interconnection portion 143 and a first via portion 144, which are integrally connected to each other. The first interconnection portion 143 may be provided under the first via portion 144 and may be connected to the first via portion 144. A length of the first interconnection portion 143 in the first direction D1 or the second direction D2 may be greater than a length of the first via portion 144 in the first direction D1 or the second direction D2. The first interconnection portion 143 may have a long axis extending in the first direction D1 or the second direction D2. The first interconnection portion 143 may be a portion extending in the first direction D1 or the second direction D2, and the first via portion 144 may be a portion protruding from the first interconnection portion 143 toward the first surface 140a of the lower redistribution substrate 140.

The first passivation layer 161 may include an insulating material that is different from an insulating material of the first insulating layer 141. For example, the first passivation layer 161 may include an Ajinomoto build-up film (ABF) or a solder resist.

The under bump pattern 170 may be disposed in an opening of the first passivation layer 161 and may be electrically connected to the first redistribution patterns 142. The under bump pattern 170 may include, for example, copper. A portion of the under bump pattern 170, which is in contact with the first passivation layer 161, may include a seed/barrier pattern BP.

The first semiconductor chip 120 may be provided on a first surface 140a of the lower redistribution substrate 140. The first semiconductor chip 120 may be, for example, a logic chip, including first chip pads 122. The first semiconductor chip 120 may be disposed on the lower redistribution substrate 140 such that a first chip pad 122 of the first semiconductor chip 120 faces the lower redistribution substrate 140. The first chip pad 122 may include, for example, aluminum (Al).

The first semiconductor chip 120 may be electrically connected to the first redistribution patterns 142 without an additional connection terminal (for example, a bump or a solder ball). For example, the first semiconductor package 100 of FIG. 1 may be a fan-out semiconductor package formed by a chip first process.

The upper redistribution substrate 150 may be spaced apart from the lower redistribution substrate 140 in the third direction D3 with the first semiconductor chip 120 interposed therebetween. The upper redistribution substrate 150 may include second insulating layers 151 and second redistribution patterns 152. The upper redistribution substrate 150 may further include a second passivation layer 162 disposed thereon. The second insulating layers 151 and the second redistribution patterns 152 may be substantially the same as the first insulating layers 141 and the first redistribution patterns 142. For example, the second insulating layers 151 may include a photosensitive insulating material. Each of the second redistribution patterns 152 may include a conductive pattern CP and a seed/barrier pattern BP. Each of the second redistribution patterns 152 may include a second interconnection portion 153 and a second via portion 154. The second interconnection portion 153 and the second via portion 154 may be substantially the same as the first interconnection portion 143 and the first via portion 144, respectively. For example, the second passivation layer 162 may include an Ajinomoto build-up film (ABF) or a solder resist.

Third redistribution patterns 112 and the vertical conductive structures 110 may be provided between the lower redistribution substrate 140 and the upper redistribution substrate 150. The vertical conductive structures 110 and the third redistribution patterns 112 may be disposed adjacent to or on a side surface of the first semiconductor chip 120. The vertical conductive structure 110 and the third redistribution pattern 112 will be described later in detail.

The encapsulant 130 may be disposed on the lower redistribution substrate 140 and may cover at least a portion of the first semiconductor chip 120, the vertical conductive structure 110, the third redistribution pattern 112, and the lower redistribution substrate 140. The encapsulant 130 may include an insulating material. The encapsulant 130 may include, for example, a thermosetting resin (e.g., an epoxy resin), a thermoplastic resin (e.g., polyimide), or a resin obtained by providing a reinforcing material (e.g., an inorganic filler) into the thermosetting resin or the thermoplastic resin. For example, the encapsulant 130 may include an Ajinomoto build-up film (ABF), FR-4, bismaleimide triazine (BT), or an epoxy molding compound (EMC). In example embodiments, the encapsulant 130 may include the Ajinomoto build-up film (ABF).

The second semiconductor package 200 may be provided on an upper surface of the upper redistribution substrate 150. The second semiconductor package 200 may include a package substrate 210, a second semiconductor chip 220, and a molding member 230. The molding member 230 may include, for example, an epoxy molding compound. The package substrate 210 may be a printed circuit board or a redistribution substrate. Metal pads 211a and 211b may be provided on both surfaces of the package substrate 210.

The second semiconductor chip 220 may be, for example, a memory chip such as a dynamic random access memory (DRAM) chip or a NAND flash memory chip. The second semiconductor chip 220 may be a different kind of a semiconductor chip from the first semiconductor chip 120. A second chip pad 222 disposed on one surface of the second semiconductor chip 220 may be connected to the metal pad 211b of the package substrate 210 by a wire bonding method.

A connection terminal 240 may be disposed between the first semiconductor package 100 and the second semiconductor package 200. The connection terminal 240 may be in contact with the metal pad 211a and the second redistribution pattern 152. The connection terminal 240 may be electrically connected to the metal pad 211a and the second redistribution pattern 152. Thus, the second semiconductor package 200 may be electrically connected to the first semiconductor chip 120 and the external connection terminal 180 through the connection terminal 240, the upper redistribution substrate 150, the vertical conductive structure 110, the third redistribution pattern 112, and the lower redistribution substrate 140.

FIG. 2 schematically illustrates a planar shape of the first semiconductor package 100 of FIG. 1. Some components of the first semiconductor package 100 are omitted in FIG. 2 for clarity of other components.

Referring to FIGS. 1 and 2, each of the vertical conductive structures 110 may have, for example, a cylindrical shape. Each of the vertical conductive structures 110 may have a circular shape or a shape similar to a circle when viewed in a plan view. However, embodiments are not limited thereto. For example, each of the vertical conductive structures 110 may have a square pillar shape or other polygonal pillar shape. The vertical conductive structures 110 may be arranged adjacent to the first semiconductor chip 120 and surround the first semiconductor chip 120. A diameter W of each of the vertical conductive structures 110 may range from 60 μm to 75 μm.

Figure 4:
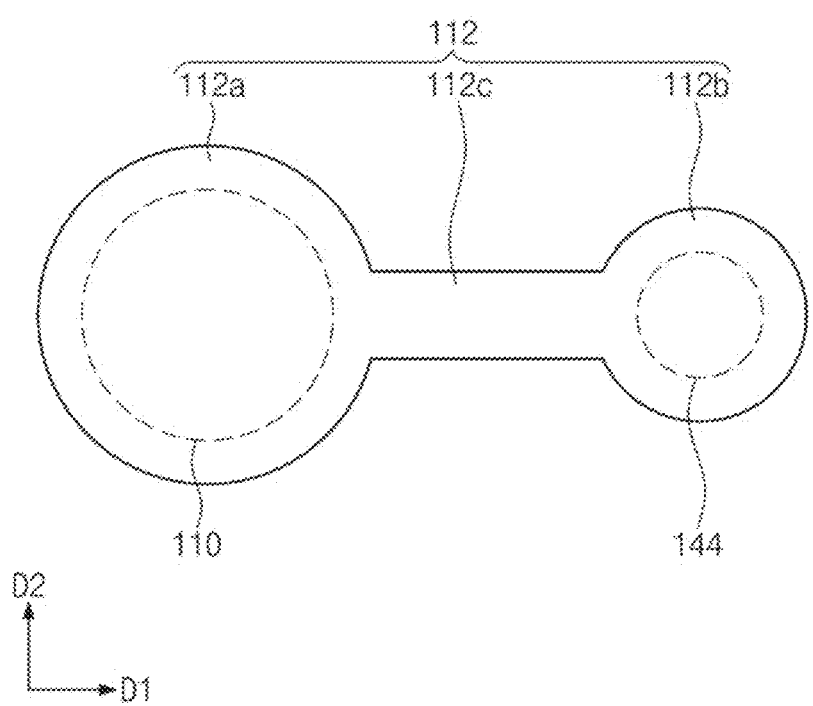
FIG. 4 is a plan view schematically illustrating a third redistribution pattern of FIG. 3.

FIG. 3 is an enlarged view of a portion 'aa' of FIG. 1. FIG. 4 is a plan view schematically illustrating a third redistribution pattern of FIG. 3.

Referring to FIGS. 1 and 3, the vertical conductive structure 110 may have a top surface 110T, a bottom surface 110B, and a side surface 110S. A distance from the bottom surface 110B to the top surface 110T in the third direction D3 may correspond to a height H. The height H of the vertical conductive structure 110 may range from 80 μm to 120 μm.

The top surface 110T of the vertical conductive structure 110 may be in contact with the second via portion 154 of the second redistribution pattern 152. The bottom surface 110B of the vertical conductive structure 110 may be in contact with a top surface of the third redistribution pattern 112. The side surface 110S of the vertical conductive structure 110 may be in contact with the encapsulant 130.

The third redistribution pattern 112 may be provided between the vertical conductive structure 110 and the lower redistribution substrate 140. A level of the bottom surface 110B of the vertical conductive structure 110 may be higher than a level of a bottom surface 122B of the first chip pad 122. The third redistribution pattern 112 and the vertical conductive structure 110 may include, for example, copper.

Referring to FIGS. 1 and 4, the third redistribution pattern 112 may include a first pad portion 112a, a second pad portion 112b, and a third interconnection portion 112c connecting the first and second pad portions 112a and 112b. The first pad portion 112a may be a portion connected to the vertical conductive structure 110, and the second pad portion 112b may be a portion connected to the first via portion 144 of the first redistribution pattern 142. In example embodiments, the vertical conductive structure 110 may not vertically overlap with the first via portion 144 of the first redistribution pattern 142.

Referring again to FIGS. 1 and 3, the third redistribution pattern 112 may not include a via portion, unlike the first and second redistribution patterns 142 and 152. The third redistribution pattern 112 may be in contact with the first via portion 144 of an uppermost one of the first redistribution patterns 142. A portion of the top surface of the third redistribution pattern 112 may be in contact with the vertical conductive structure 110. A remaining portion of the top surface of the third redistribution pattern 112 may be in contact with the encapsulant 130.

The third redistribution pattern 112 may include a seed pattern SP thereunder. As described below, the seed pattern SP may be formed by patterning copper foil. The seed pattern SP may not include titanium, unlike the seed/barrier pattern BP described above.

The seed pattern SP under the third redistribution pattern 112 may be in contact with the seed/barrier pattern BP of the uppermost one of the first redistribution patterns 142, and an interface therebetween may be observed.

The vertical conductive structure 110 and the third redistribution pattern 112 may provide an electrical path for connecting the first redistribution pattern 142 and the second redistribution pattern 152.

According to example embodiments, the third redistribution pattern 112 may be additionally provided between the lower redistribution substrate 140 and the vertical conductive structure 110, and thus a degree of freedom of interconnection may be increased. In addition, the third redistribution pattern 112 as well as the vertical conductive structure 110 may be in contact with the encapsulant 130, and thus interface separation between a conductive material and an insulating material may be reduced. As a result, reliability of the semiconductor package device may be improved.

FIGS. 5 to 13 are cross-sectional views illustrating a method of manufacturing the semiconductor package device 1 of FIG. 1.

Figure 5:
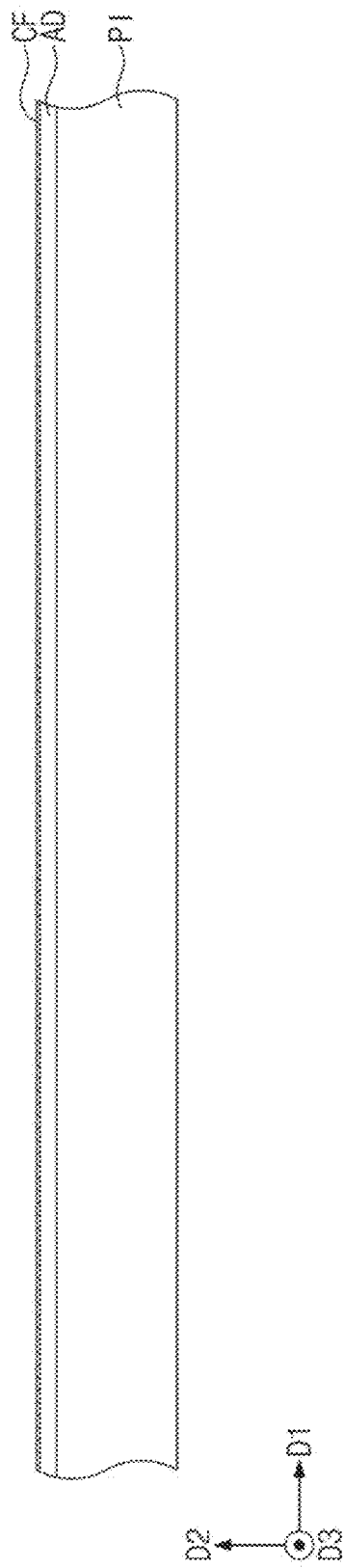
FIGS. 5, 6, 7, 8, 9, 10, 11, 12, and 13 are cross-sectional views illustrating a method of manufacturing the semiconductor package device of FIG. 1.

Referring to FIG. 5, a tape substrate PI onto which an adhesive layer AD is adhered may be provided. The adhesive layer AD and the tape substrate PI may include an organic material. The tape substrate PI may include, for example, polyimide. A thickness of the tape substrate PI may range from 75 μm to 100 μm. Copper foil CF may be adhered on the adhesive layer AD. For example, a thickness of the copper foil CF may be 1.5 μm.

Figure 6:
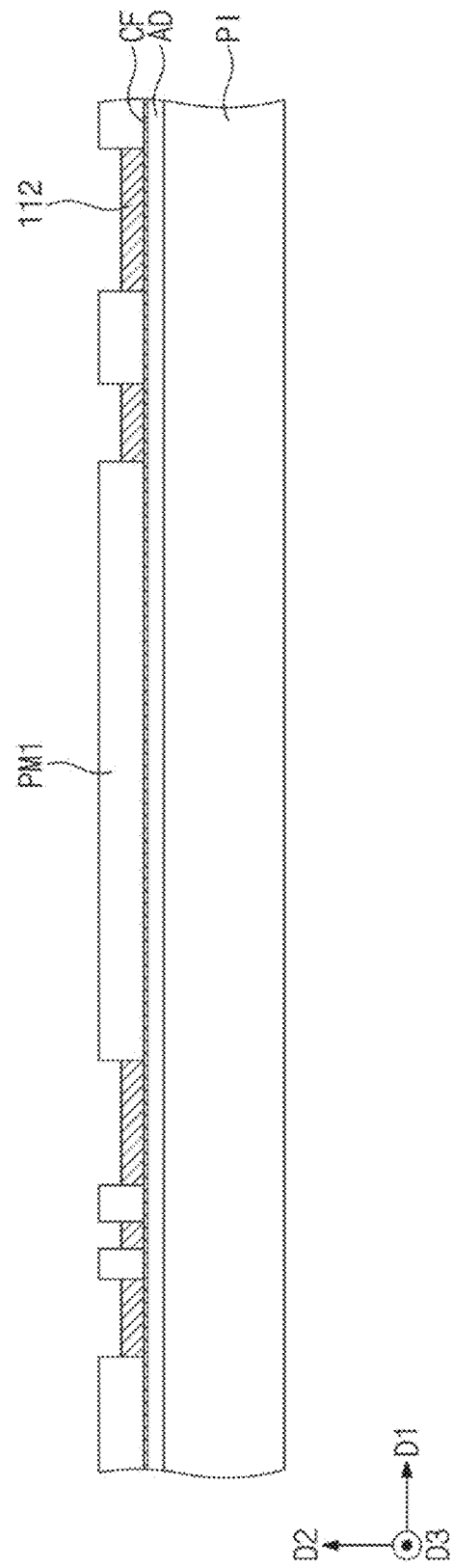

Referring to FIG. 6, a first photo mask pattern PM1 may be formed on the copper foil CF. The first photo mask pattern PM1 may have an opening forming a space in which a third redistribution pattern 112 will be formed. The first photo mask pattern PM1 may be formed through a coating process of a photoresist layer, an exposure process, and a development process. The copper foil CF may be exposed by the first photo mask pattern PM1. A third redistribution pattern 112 may be formed in the opening by performing an electroplating process using the copper foil CF as an electrode.

Figure 7:
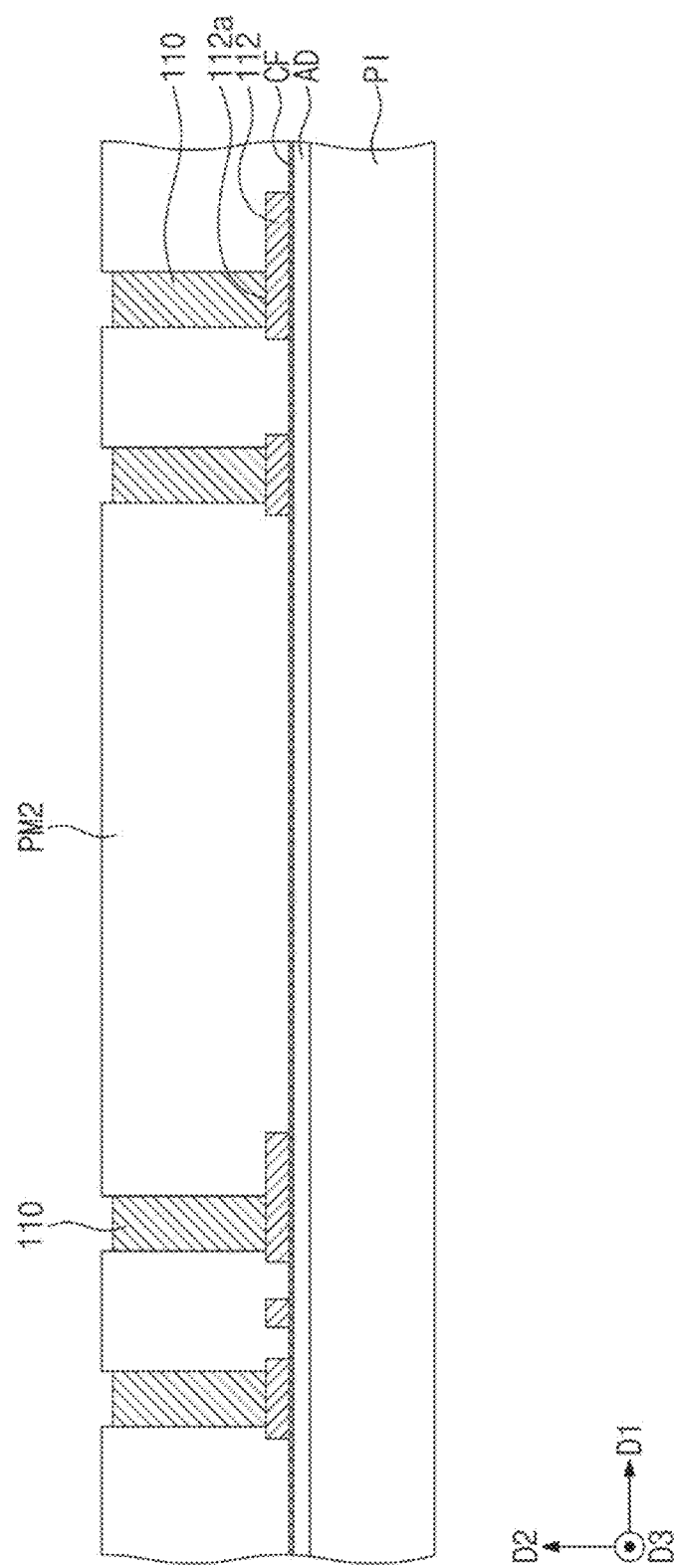

Referring to FIG. 7, the first photo mask pattern PM1 may be removed. Next, a second photo mask pattern PM2 exposing a portion of the third redistribution pattern 112 may be formed. The second photo mask pattern PM2 may have an opening forming a space in which a vertical conductive structure 110 will be formed. The second photo mask pattern PM2 may be formed by substantially the same method as the first photo mask pattern PM1. A portion of the third redistribution pattern 112 may be exposed by the openings of the second photo mask pattern PM2. The exposed portion of the third redistribution pattern 112 may correspond to the first pad portion 112a of FIG. 4. A vertical conductive structure 110 may be formed on the third redistribution pattern 112 by performing an electroplating process using the copper foil CF as an electrode.

According to the example embodiments, the vertical conductive structure 110 may be formed using the electroplating process, and thus a diameter of the vertical conductive structure 110 may be reduced and a manufacturing cost may be reduced. In particular, the manufacturing cost and the diameter of the vertical conductive structure 110 may be reduced as compared with a process of forming a vertical conductive structure by etching a copper (Cu) plate.

Figure 8:
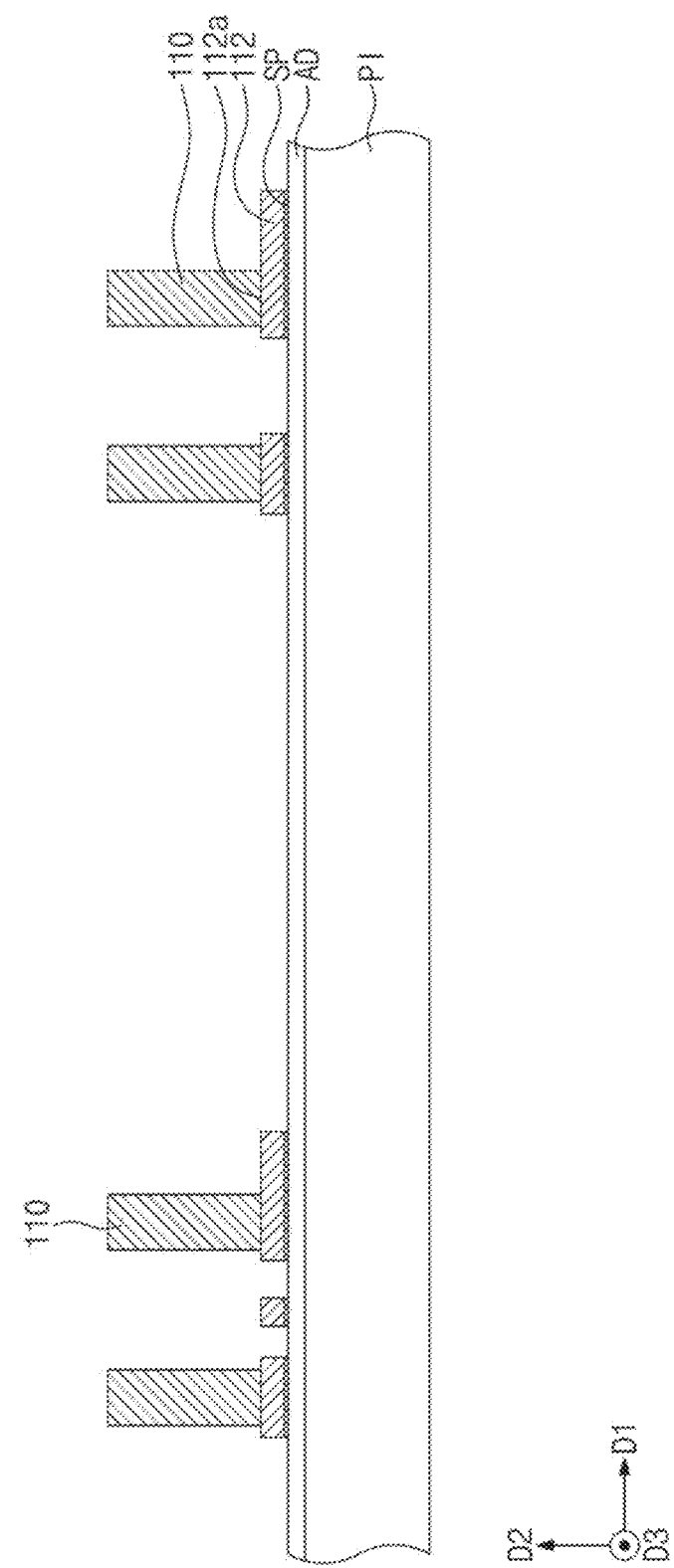

Referring to FIG. 8, the second photo mask pattern PM2 may be removed. Next, exposed copper foil CF may be patterned to form a seed pattern SP. A remaining portion of the copper foil CF except a portion vertically overlapping with the third redistribution pattern 112 may be etched and removed. The etching process may be, for example, a wet etching process. The adhesive layer AD may be exposed by the etching process of the copper foil CF.

Figure 9:
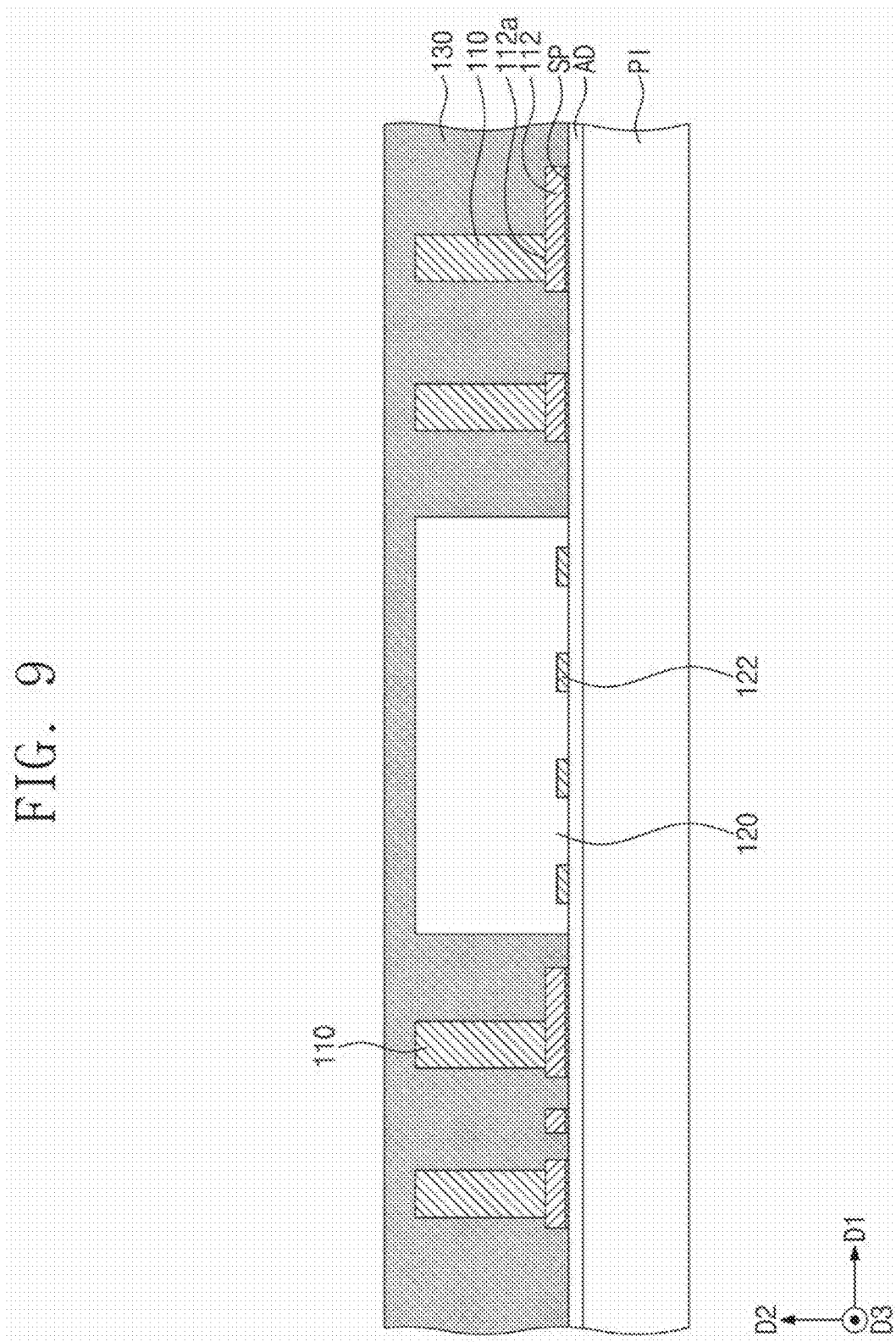

Referring to FIG. 9, a first semiconductor chip 120 may be provided on the exposed adhesive layer AD. The first semiconductor chip 120 may be disposed in such a way that an active surface having a first chip pad 122 faces the adhesive layer AD. Subsequently, an encapsulant 130 may be formed to cover the first semiconductor chip 120 and the vertical conductive structure 110.

Figure 10:
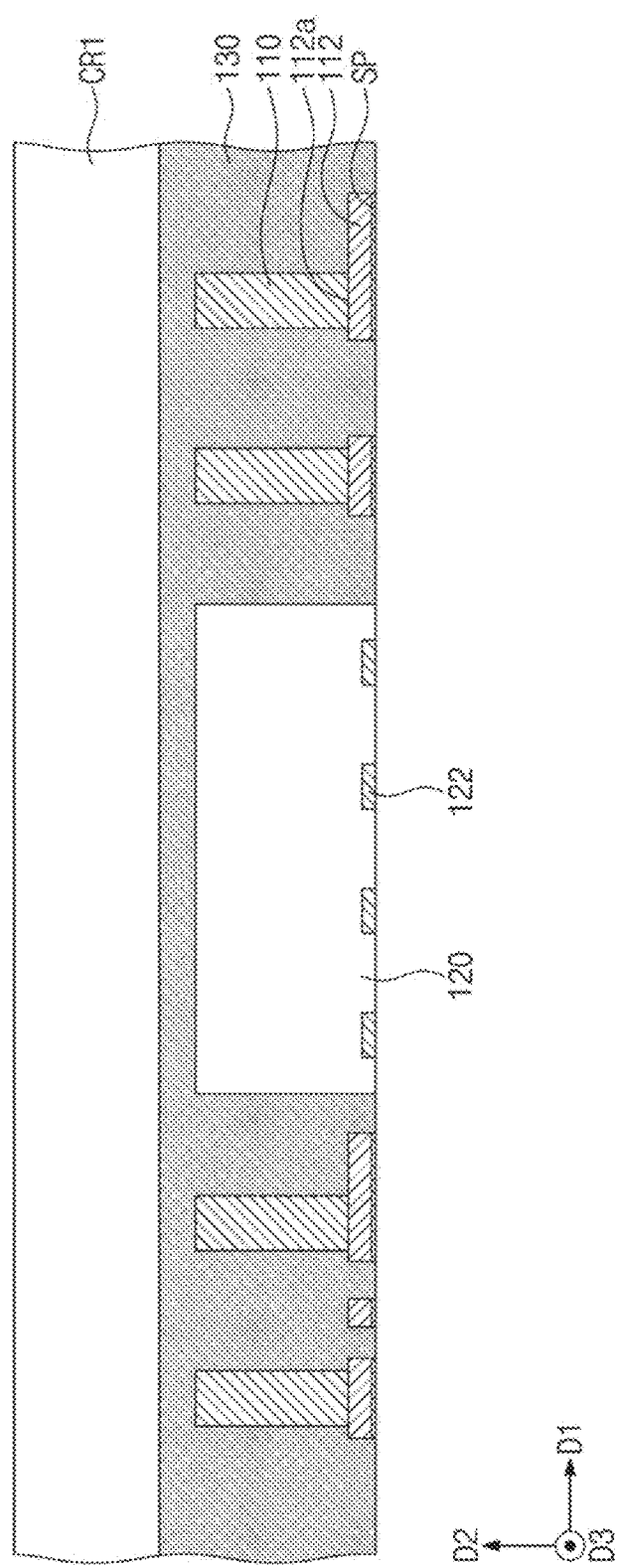

Referring to FIG. 10, a first carrier substrate CR1 may be provided on the encapsulant 130. The first carrier substrate CR1 may be, for example, a glass substrate, a silicon substrate, or a metal substrate. Next, the adhesive layer AD and the tape substrate PI may be removed. The lower surface of the encapsulant 130, the seed pattern SP, and the first chip pad 122 may be exposed by the removal of the adhesive layer AD.

Figure 11:
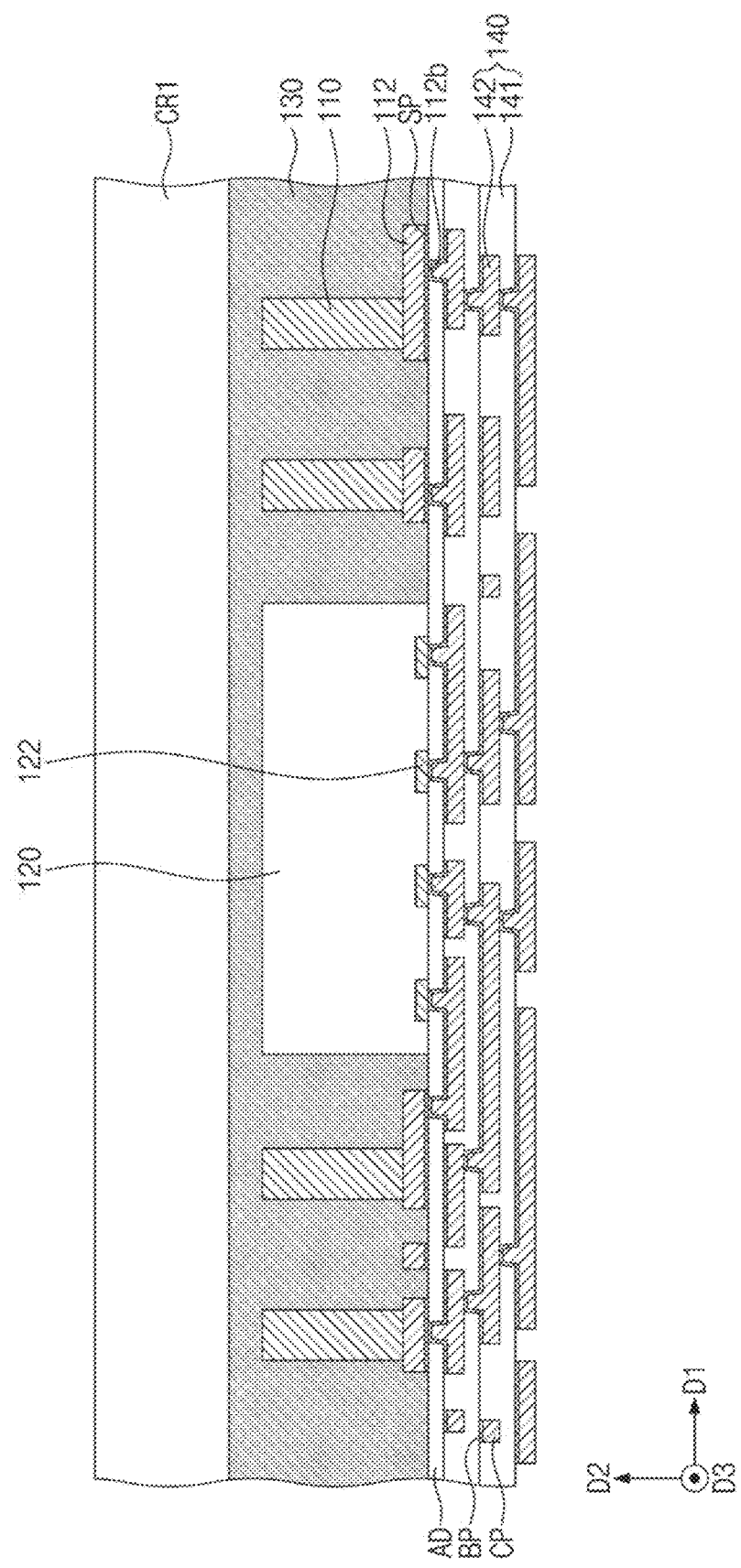

Referring to FIG. 11, a lower redistribution substrate 140 may be formed on the third redistribution pattern 112 and the first chip pad 122 in a state in which the structure of FIG. 10 is turned over. For example, a first insulating layer 141 may be formed to cover the third redistribution pattern 112 and the first chip pad 122. The first insulating layer 141 may expose the second pad portion 112b of the third redistribution pattern 112 and the first chip pad 122 by exposure and development processes. A hardening process of the first insulating layer 141 may be performed. A seed/barrier layer including, for example, titanium/copper may be formed to cover a top surface of the first insulating layer 141. A photo mask pattern defining a first redistribution pattern 142 may be formed, and then, a conductive pattern CP may be formed by an electroplating method. Next, the seed/barrier layer BP may be patterned by an etching process to form a seed/barrier pattern BP. The first insulating layers 141 and the first redistribution patterns 142 may be sequentially formed by repeating the processes described above.

Figure 12:
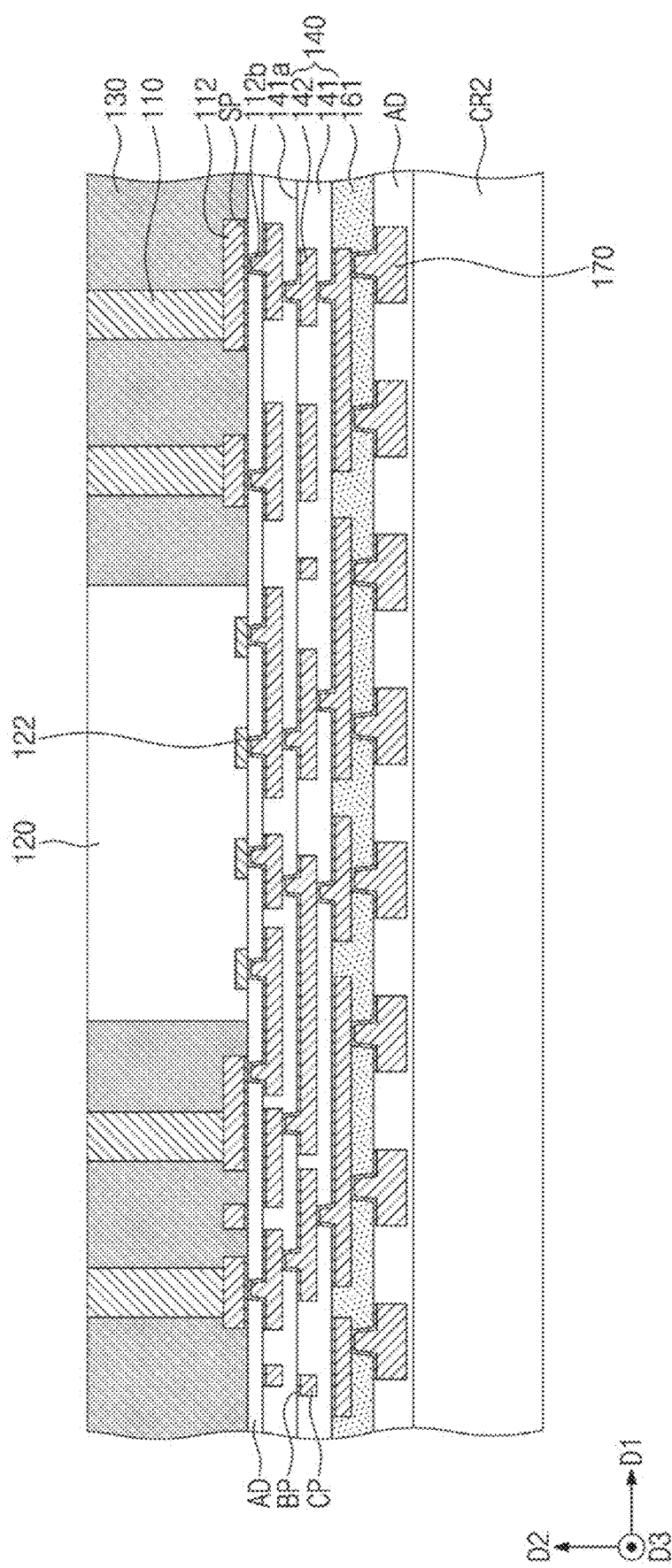

Referring to FIG. 12, a first passivation layer 161 may be formed on the first redistribution pattern 142 located farthest from the first chip pad 122 in the third direction D3. An opening exposing the first redistribution pattern 142 may be formed in the first passivation layer 161 by a laser drilling process. An under bump pattern 170 may be formed to fill the opening. A second carrier substrate CR2 onto which an adhesive layer AD is adhered may be provided on the first passivation layer 161. The second carrier substrate CR2 may be, for example, a glass substrate, a silicon substrate, or a metal substrate.

Next, the first carrier substrate CR1 may be removed, and then, a planarization process may be performed on the encapsulant 130. The planarization process of the encapsulant 130 may include, for example, a chemical mechanical polishing (CMP) process. A top surface of the vertical conductive structure 110 may be exposed by the planarization process.

Figure 13:
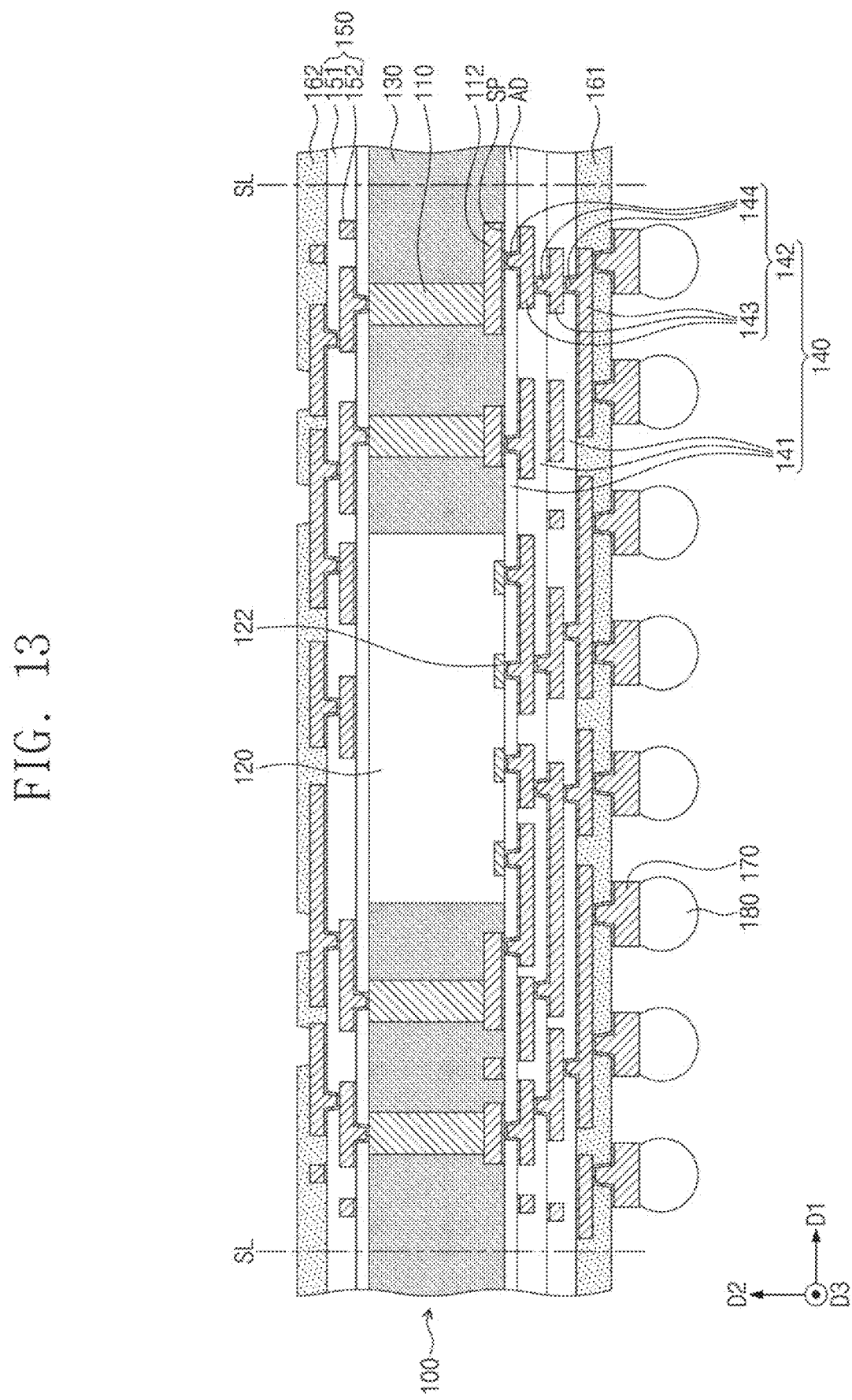

Referring to FIG. 13, an upper redistribution substrate 150 may be formed on the encapsulant 130. The upper redistribution substrate 150 may be formed by substantially the same method as the lower redistribution substrate 140. A second passivation layer 162 may be formed on an uppermost second insulating layer 151 and an uppermost second redistribution pattern 152. An opening exposing the second redistribution pattern 152 may be formed in the second passivation layer 162 by a laser drilling process. Next, the second carrier substrate CR2 and the adhesive layer AD may be removed. External connection terminals 180 may be formed on exposed under bump patterns 170. A sawing process may be performed along a sawing line SL to form a first semiconductor package 100.

Referring again to FIG. 1, a second semiconductor package 200 may be attached on the first semiconductor package 100. As a result, the semiconductor package device 1 may be manufactured.

Figure 14:
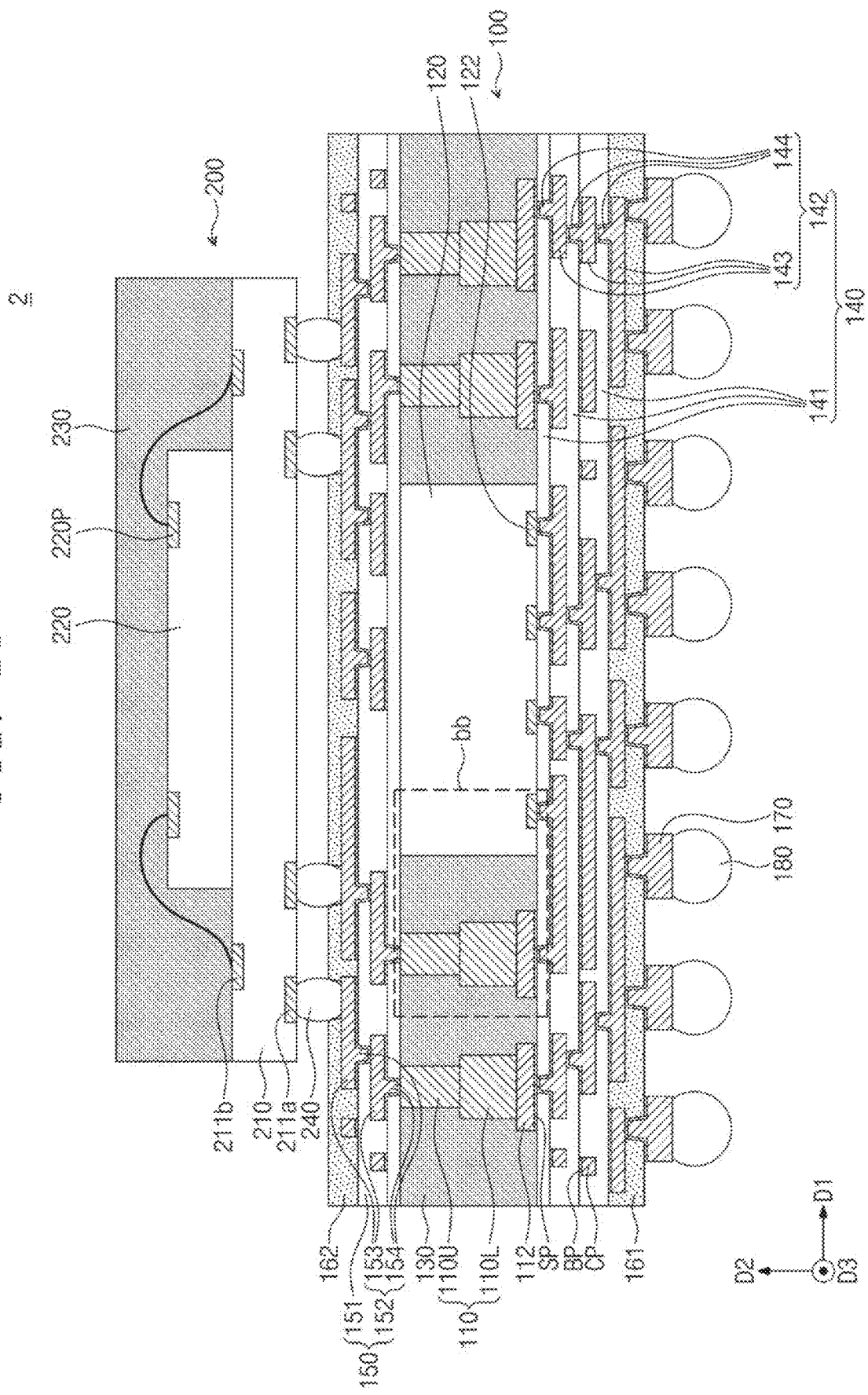
FIG. 14 is a cross-sectional view illustrating a semiconductor package device according to example embodiments.
Figure 15:
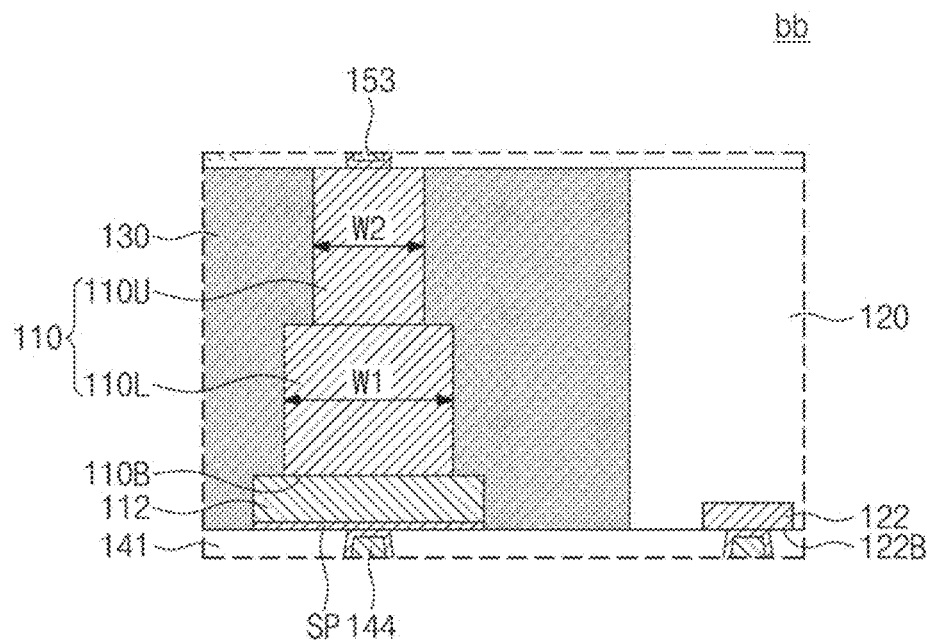
FIG. 15 is an enlarged view of a portion 'bb' of FIG. 14.

FIG. 14 is a cross-sectional view illustrating a semiconductor package device 2 according to example embodiments. FIG. 15 is an enlarged view of a portion 'bb' of FIG. 14. Hereinafter, the descriptions to the same components and features as mentioned with reference to FIGS. 1 to 4 will be omitted for the purpose of ease and convenience in explanation.

Referring to FIGS. 14 and 15, a vertical conductive structure 110 may include a lower structure 110L and an upper structure 110U. The upper structure 110U may be provided on the lower structure 110L. The upper structure 110U and the lower structure 110L may be integrally connected to each other.

Each of the lower structure 110L and the upper structure 110U may have a pillar shape. The vertical conductive structure 110 may have a multistage shape. The lower structure 110L may have a first diameter W1 in the first direction D1 and/or the second direction D2. The upper structure 110U may have a second diameter W2 in the first direction D1 and/or the second direction D2. The first diameter W1 and the second diameter W2 may be different from each other.

As illustrated in FIG. 15, the first diameter W1 may be greater than the second diameter W2. A portion of a top surface of the lower structure 110L may be exposed. The exposed portion of the top surface of the lower structure 110L may be in contact with the encapsulant 130. Since the vertical conductive structure 110 has the multistage shape, a contact area between the vertical conductive structure 110 and the encapsulant 130 may be increased. Thus, interface separation between the vertical conductive structure 110 and the encapsulant 130 may be reduced.

Figure 16:
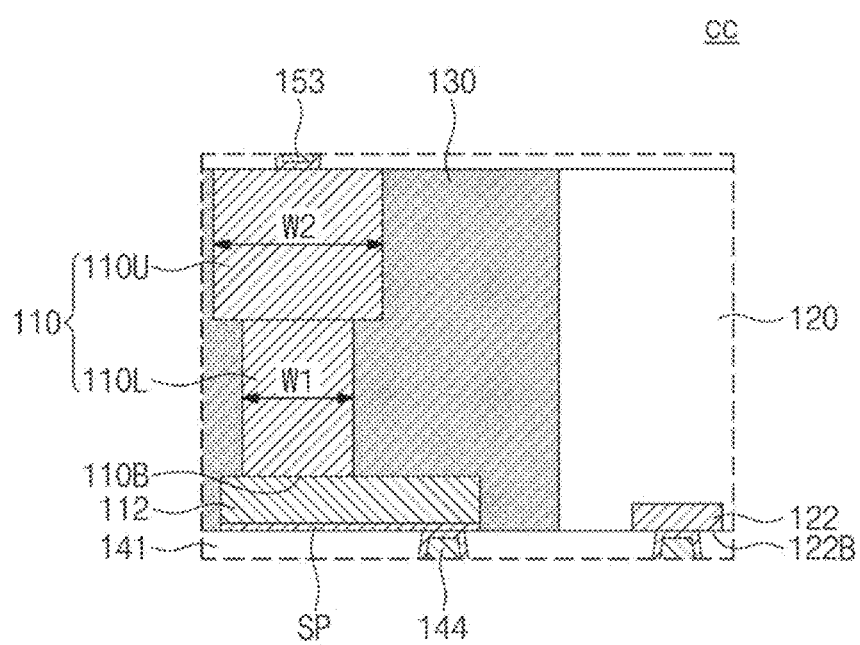
FIG. 16 is an enlarged view corresponding to the portion 'bb' of FIG. 14 to illustrate a semiconductor package device according to example embodiments.

In example embodiments, as illustrated in FIG. 16, the first diameter W1 may be less than the second diameter W2. In this case, a portion of a bottom surface of the upper structure 110U may be in contact with the encapsulant 130.

FIGS. 17 to 20 are cross-sectional views illustrating a method of manufacturing the semiconductor package device 2 of FIG. 14.

Figure 17:
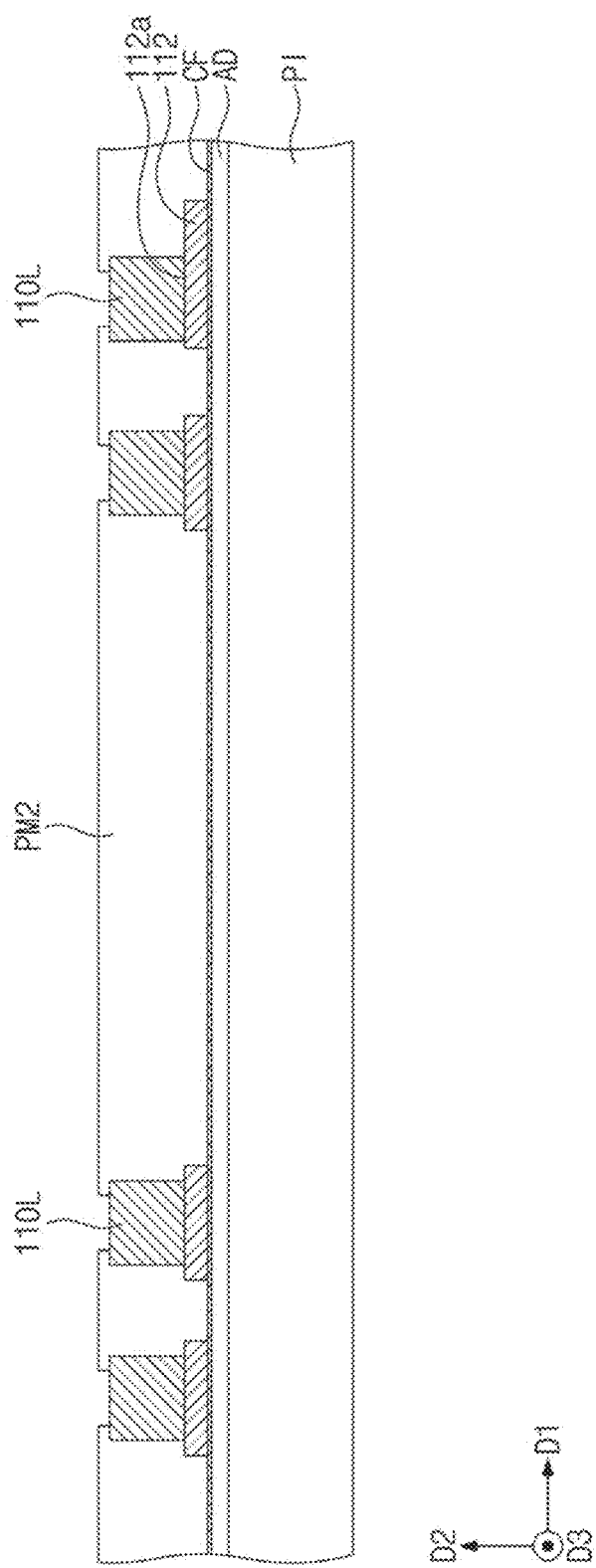
Figure 18:
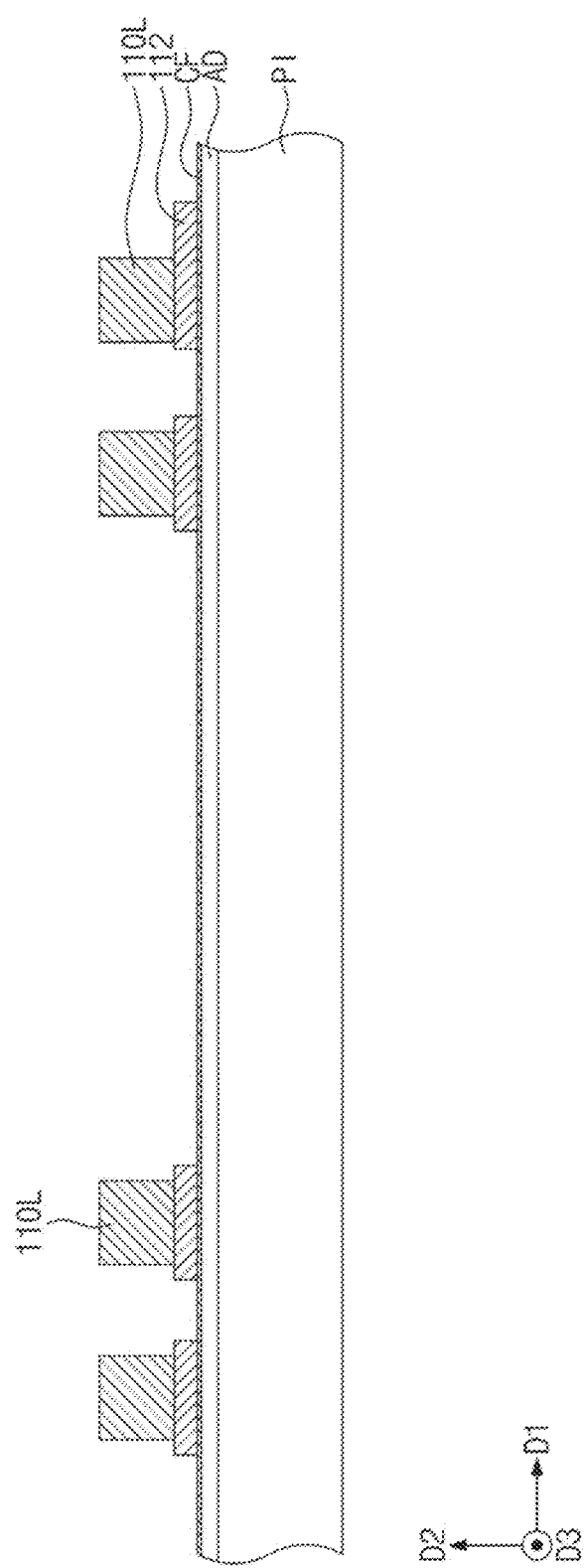

Referring to FIGS. 5 and 17, the second photo mask pattern PM2 exposing the first pad portion 112a of the third redistribution pattern 112 may be formed. A lower structure 110L may be formed by an electroplating process using the copper foil CF as an electrode. Referring to FIG. 18, the second photo mask pattern PM2 may be removed.

Referring to FIG. 19, a third photo mask pattern PM3 exposing a portion of a top surface of the lower structure 110L may be formed. An upper structure 110U may be formed by an electroplating process using the copper foil CF as an electrode.

Referring to FIG. 20, the third photo mask pattern PM3 may be removed. Next, the exposed copper foil CF may be patterned by an etching process to form a seed pattern SP. Subsequent processes may be substantially the same as described with reference to FIGS. 9 to 13.

The semiconductor package device according to example embodiments may include the lower redistribution substrate, the upper redistribution substrate, and the vertical conductive structure therebetween. The semiconductor package device may further include an additional redistribution pattern between the lower redistribution substrate and the vertical conductive structure. As a result, the degree of freedom of interconnection of the first semiconductor package may be increased. According to example embodiments, the vertical conductive structure may have the multistage structure, and thus the interface separation between the vertical conductive structure and the encapsulant may be reduced.

According to the example embodiments, the vertical conductive structure may be formed by the electroplating method, and thus the vertical conductive structure having a smaller diameter may be formed.

While example embodiments have been described, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package device comprising:
a lower redistribution substrate comprising a first redistribution pattern, the first redistribution pattern comprising a first interconnection portion and a first via portion provided on the first interconnection portion;
a semiconductor chip disposed on the lower redistribution substrate, the semiconductor chip comprising a chip pad facing the lower redistribution substrate;
an upper redistribution substrate vertically spaced apart from the lower redistribution substrate, the upper redistribution substrate comprising a second redistribution pattern;
a vertical conductive structure disposed between the lower redistribution substrate and the upper redistribution substrate and disposed at a side of the semiconductor chip;
a third redistribution pattern disposed between the lower redistribution substrate and the vertical conductive structure; and
an encapsulant disposed on the semiconductor chip, the vertical conductive structure, and the third redistribution pattern,
wherein the first via portion is in contact with the third redistribution pattern, and
wherein a level of a bottom surface of the vertical conductive structure is higher than a level of a bottom surface of the chip pad,
wherein the lower redistribution substrate further comprises a first photosensitive insulating layer,
wherein a top surface and a side surface of the third redistribution pattern are in contact with the encapsulant, and
wherein a bottom surface of the third redistribution pattern is in contact with the first photosensitive insulating layer.

2. The semiconductor package device of claim 1, wherein the vertical conductive structure has a pillar shape,
wherein a height of the vertical conductive structure ranges from 80 μm to 120 μm, and
wherein a diameter of the vertical conductive structure ranges from 60 μm to 75 μm.

3. The semiconductor package device of claim 1,
wherein the upper redistribution substrate further comprises a second photosensitive insulating layer,
wherein the encapsulant includes an Ajinomoto build-up film (ABF),
wherein the first redistribution pattern is disposed in the first photosensitive insulating layer, and
wherein the second redistribution pattern is disposed in the second photosensitive insulating layer.

4. The semiconductor package device of claim 3, wherein the lower redistribution substrate further comprises:
a first passivation layer disposed under the first photosensitive insulating layer; and
an under bump pattern disposed in the first passivation layer,
wherein the first passivation layer includes an insulating material that is different from an insulating material of the first photosensitive insulating layer.

5. The semiconductor package device of claim 3, wherein the upper redistribution substrate further comprises:
a second passivation layer disposed on the second photosensitive insulating layer, wherein the second passivation layer includes an insulating material that is different from an insulating material of the second photosensitive insulating layer, and
wherein the second passivation layer includes an opening exposing the second redistribution pattern.

6. The semiconductor package device of claim 1, wherein a top surface of the vertical conductive structure is in contact with a bottom surface of the upper redistribution substrate,
wherein the bottom surface of the vertical conductive structure is in contact with a top surface of the third redistribution pattern, and
wherein a side surface of the vertical conductive structure is in contact with the encapsulant.

7. The semiconductor package device of claim 1, wherein the vertical conductive structure comprises a lower structure and an upper structure disposed on the lower structure,
wherein each of the lower structure and the upper structure has a pillar shape, and
wherein a diameter of the lower structure is different from a diameter of the upper structure.

8. The semiconductor package device of claim 7, wherein the diameter of the lower structure is greater than the diameter of the upper structure, and
wherein a portion of a top surface of the lower structure is in contact with the encapsulant.

9. The semiconductor package device of claim 7, wherein the diameter of the upper structure is greater than the diameter of the lower structure, and
wherein a portion of a bottom surface of the upper structure is in contact with the encapsulant.

10. The semiconductor package device of claim 1, wherein the second redistribution pattern comprises a second interconnection portion and a second via portion disposed on the second interconnection portion, and
wherein the second via portion is in contact with a top surface of the vertical conductive structure.

11. The semiconductor package device of claim 1, wherein an entire bottom surface of the third redistribution pattern is substantially flat.

12. A semiconductor package device comprising:
a lower redistribution substrate comprising a first insulating layer and a first redistribution pattern;
a semiconductor chip disposed on the lower redistribution substrate;
an upper redistribution substrate vertically spaced apart from the lower redistribution substrate, the upper redistribution substrate comprising a second insulating layer and a second redistribution pattern;
a vertical conductive structure disposed between the lower redistribution substrate and the upper redistribution substrate and disposed at a side of the semiconductor chip;
a third redistribution pattern disposed between the lower redistribution substrate and the vertical conductive structure; and
an encapsulant disposed on the semiconductor chip, the vertical conductive structure, and the third redistribution pattern,
wherein an insulating material of the first insulating layer is different from an insulating material of the encapsulant,
wherein a top surface and a side surface of the third redistribution pattern are in contact with the encapsulant, and
wherein a bottom surface of the third redistribution pattern is in contact with the first insulating layer.

13. The semiconductor package device of claim 12, wherein the third redistribution pattern comprises:
a first pad portion;
a second pad portion; and
an interconnection portion connecting the first pad portion and the second pad portion,
wherein the first pad portion is connected to the vertical conductive structure, and the second pad portion is connected to a via portion of the first redistribution pattern,
wherein the via portion is in contact with the third redistribution pattern.

14. The semiconductor package device of claim 12, wherein the semiconductor chip comprises a chip pad facing the lower redistribution substrate, and
wherein a level of a bottom surface of the vertical conductive structure is higher than a level of a bottom surface of the chip pad.

15. The semiconductor package device of claim 12, wherein the vertical conductive structure comprises a lower structure and an upper structure disposed on the lower structure,
wherein each of the lower structure and the upper structure has a pillar shape, and
wherein a diameter of the lower structure is different from a diameter of the upper structure.

16. The semiconductor package device of claim 15, wherein the diameter of the lower structure is greater than the diameter of the upper structure, and
wherein a portion of a top surface of the lower structure is in contact with the encapsulant.

17. The semiconductor package device of claim 15, wherein the diameter of the upper structure is greater than the diameter of the lower structure, and
wherein a portion of a bottom surface of the upper structure is in contact with the encapsulant.

18. A semiconductor package device comprising:
a first semiconductor package;
a second semiconductor package disposed on the first semiconductor package; and
a plurality of first connection terminals disposed between the first semiconductor package and the second semiconductor package,
wherein the first semiconductor package comprises:
a lower redistribution substrate;
a semiconductor chip being in contact with the lower redistribution substrate, the semiconductor chip comprising chip pads adjacent to the lower redistribution substrate;
a plurality of vertical conductive structures disposed on a first surface of the lower redistribution substrate and spaced apart from a side surface of the semiconductor chip;
an upper redistribution substrate vertically spaced apart from the lower redistribution substrate with the semiconductor chip interposed therebetween;
second connection terminals disposed under the lower redistribution substrate; and
first redistribution patterns disposed between the lower redistribution substrate and the plurality of vertical conductive structures,
wherein the lower redistribution substrate comprises:
an insulating layer; and
second redistribution patterns which are vertically stacked in the insulating layer, each of the second redistribution patterns comprising a second interconnection portion and a via portion, wherein at least one of the first redistribution patterns comprises a first pad portion, a second pad portion, and a first interconnection portion connecting the first pad portion and the second pad portion, wherein the first pad portion is connected to a vertical conductive structure among the plurality of vertical conductive structures, and the second pad portion is connected to a via portion of a second redistribution pattern among the second redistribution patterns, wherein each of the plurality of vertical conductive structures has a pillar shape, wherein a height of each of the vertical conductive structures ranges from 80 μm to 120 μm, and wherein a diameter of each of the vertical conductive structures ranges from 60 μm to 75 μm.

19. The semiconductor package device of claim 18, wherein each of the plurality of vertical conductive structures comprises a lower structure and an upper structure disposed on the lower structure, wherein each of the lower structure and the upper structure has a pillar shape, and wherein a diameter of the lower structure is different from a diameter of the upper structure.

\* \* \* \* \*